(12) United States Patent
Briggs et al.

(10) Patent No.: US 10,229,967 B2
(45) Date of Patent: *Mar. 12, 2019

(54) HIGH-DENSITY MIM CAPACITORS

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, LaGrangeville, NY (US); Bartlet H. Deprospo, Goshen, NY (US); Huai Huang, Clifton Park, NY (US); Christopher J. Penny, Saratoga Springs, NY (US); Michael Rizzolo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/639,585

(22) Filed: Jun. 30, 2017

(65) Prior Publication Data

US 2017/0301749 A1   Oct. 19, 2017

Related U.S. Application Data

(63) Continuation of application No. 15/091,043, filed on Apr. 5, 2016, now Pat. No. 9,837,485.

(51) Int. Cl.
*H01L 49/02* (2006.01)
*H01L 23/522* (2006.01)

(52) U.S. Cl.
CPC .......... *H01L 28/40* (2013.01); *H01L 23/5223* (2013.01)

(58) Field of Classification Search
None
See application file for complete search history.

(56) References Cited

U.S. PATENT DOCUMENTS

| | | | |
|---|---|---|---|
| 7,091,542 B1 | 8/2006 | Yang et al. | |
| 7,186,625 B2 | 3/2007 | Chudzik et al. | |
| 7,466,534 B2 | 12/2008 | Chinthakindi | |
| 7,643,268 B2 | 1/2010 | Chinthakindi | |
| 7,866,015 B2 | 1/2011 | Chinthakindi | |
| 8,053,865 B2 | 11/2011 | Chang et al. | |
| 8,492,817 B2 | 7/2013 | Cheng et al. | |
| 8,932,932 B2 | 1/2015 | Cheng et al. | |
| 8,980,708 B2 | 3/2015 | Zhu et al. | |
| 9,276,057 B2 | 3/2016 | Liao et al. | |
| 9,397,038 B1* | 7/2016 | Uzoh | H01L 23/5223 |
| 9,837,485 B2* | 12/2017 | Briggs | H01L 23/5223 |

(Continued)

OTHER PUBLICATIONS

List of IBM Patents or Patent Applications Treated as Related dated Jun. 30, 2017, 2 pages.

*Primary Examiner* — Marcos D Pizarro Crespo
*Assistant Examiner* — Shannon Yi
(74) *Attorney, Agent, or Firm* — Tutunjian & Bitetto, P.C.; Vazken Alexanian

(57) ABSTRACT

Capacitors and methods of forming the same include forming a gap in a dielectric layer underneath one or more conducting lines, such that the one or more conducting lines are suspended over the gap. A capacitor stack is deposited in the gap and on the conducting lines. Respective contacts are deposited on the conducting lines and on the capacitor stack.

20 Claims, 5 Drawing Sheets

(56) References Cited

U.S. PATENT DOCUMENTS

2010/0195392 A1    8/2010  Freeman
2013/0120327 A1    5/2013  Seo et al.
2016/0343606 A1*  11/2016  Wu .................. H01L 21/76807

* cited by examiner

HIGH-DENSITY MIM CAPACITORS

BACKGROUND

Technical Field

The present invention relates metal-insulator-metal (MIM) capacitors and, more particularly, to high-density, air-gap, metal-insulator-metal capacitors.

Description of the Related Art

As semiconductor fabrication technologies improve, forming high-density metal-insulator-metal capacitors (MIMCAPs) becomes challenging. MIMCAPs are conventionally formed in between layers of a device, for example using a thin stack that covers a large area. In particular, it is advantageous to use high-density MIMCAPs to improve power stability, but at 10 nm and below, existing technologies become infeasible.

SUMMARY

A method for forming a capacitor includes forming a gap in a dielectric layer underneath one or more conducting lines, such that the one or more conducting lines are suspended over the gap. A capacitor stack is deposited in the gap and on the conducting lines. Respective contacts are deposited on the conducting lines and on the capacitor stack.

A method for forming a capacitor includes forming a gap in a dielectric layer underneath one or more conducting lines, such that the one or more conducting lines are suspended over the gap. Forming the gap includes damaging material in the dielectric layer in a capacitor region with a plasma process and etching the damaged material with a wet etch. A stack is deposited in the gap and on the conducting lines that has a first metallic layer in direct contact with all of the one or more conducting lines, an insulator layer, and a second metallic layer. A passivating dielectric material is deposited in the gap after depositing the capacitor stack. Respective contacts are formed on the conducting lines and on the capacitor stack.

A capacitor includes one or more conducting lines formed over a gap in a dielectric layer. A capacitor stack is formed on surfaces of the gap and on surfaces of the one or more conducting lines. The stack on the surfaces of the gap is continuous with the stack formed on surfaces of the one or more conducting lines.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention use an airgap process to form metal-insulator-metal capacitors (MIMCAPs) at a high density using fabrication technologies at 10 nm and below. The present embodiments may also be formed with standard, 1× metal lines, allowing the MIMCAPs to be positioned closer to a device layer, thereby reducing the total capacitance needed for power supply stability. The present embodiments suspend metal conductors over a gap before forming MIMCAP layers over the surfaces of the gap and of the conductors themselves. This significantly increases the surface area, and hence also the capacitance, of the resulting device, providing a significantly higher capacitance density.

Figure 1:
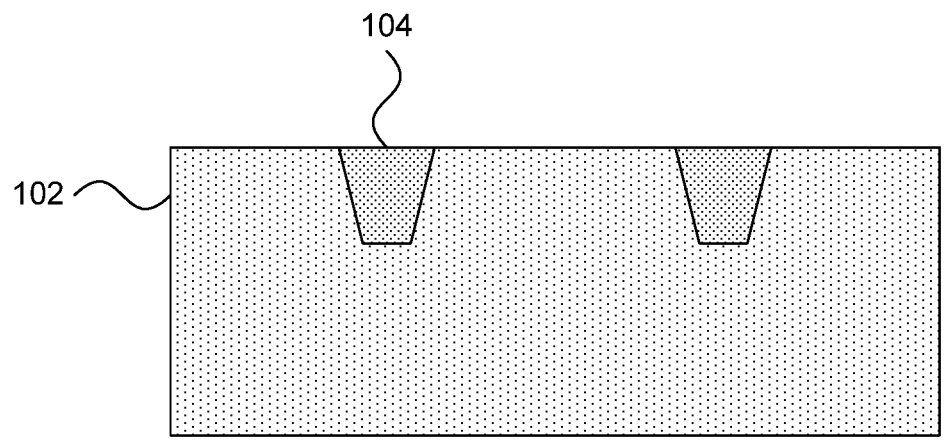
FIG. 1 is a cross-sectional diagram of a step in the formation of a metal-insulator-metal capacitor having increased capacitance density in accordance with the present principles.

Referring now to FIG. 1, a step in forming high-density MIMCAPs is shown. Trenches are formed in an inter-layer dielectric 102 and conductors 104 are formed therein. It is specifically contemplated that the inter-layer dielectric 102 may be formed from a porous dielectric material, such as silicon-carbon-oxygen-hyrdogen (SiCOH), but it should be understood that any appropriate inter-layer dielectric material may be used instead. It is specifically contemplated that copper may be used to form the conductors 104, but any appropriate conducting material may be used instead. Alternative materials for the conductors 104 include tungsten, aluminum, silver, gold and alloys thereof. Although only two conductors 104 are shown, it should be understood that any number of conductors 104 may be formed.

The trenches may be formed using a timed anisotropic etch such as, e.g., a reactive ion etch (RIE). RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 2:
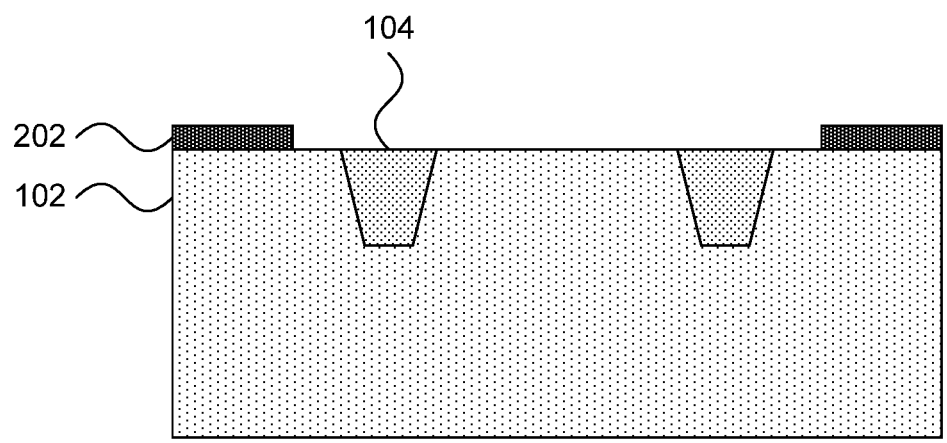
FIG. 2 is a cross-sectional diagram of a step in the formation of a metal-insulator-metal capacitor having increased capacitance density in accordance with the present principles.

Referring now to FIG. 2, a step in forming high-density MIMCAPs is shown. A hardmask 202 is formed on the inter-layer dielectric 102. The hardmask 202 deposited using any appropriate deposition process including, e.g., chemical vapor deposition (CVD), atomic layer deposition (ALD), physical vapor deposition (PVD), or gas cluster ion beam (GCIB) deposition. CVD is a deposition process in which a deposited species is formed as a result of chemical reaction between gaseous reactants at greater than room temperature (e.g., from about 25° C. to about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (EPCVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

The hardmask 202 is etched to open a gap on the inter-layer dielectric 102 over and around the conductors 104. It is specifically contemplated that the hardmask 202 may be formed using a dielectric material such as silicon nitride, but any appropriate hardmask material may be used instead. The hardmask 202 etch may be performed by applying a photoresist pattern using a lithography process. The photoresist pattern is then transferred into the hard mask material using a dry etch process. The photoresist pattern may then be removed or, alternatively, may be left on for the subsequent steps.

Figure 3:
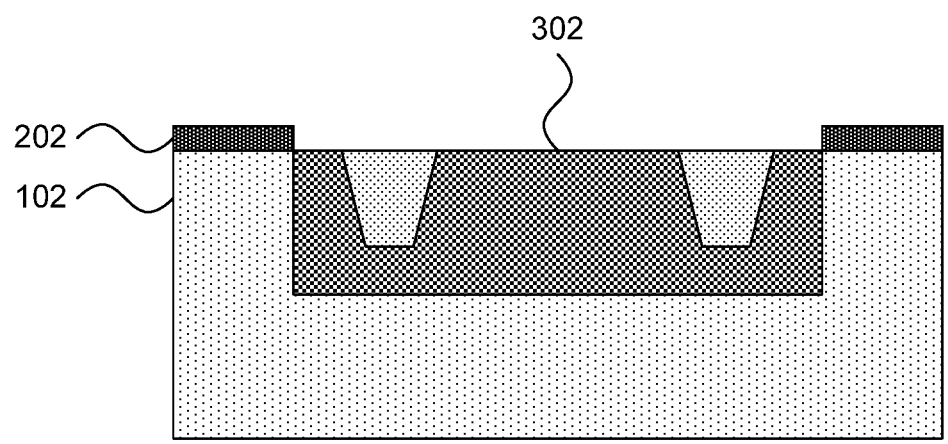
FIG. 3 is a cross-sectional diagram of a step in the formation of a metal-insulator-metal capacitor having increased capacitance density in accordance with the present principles.

Referring now to FIG. 3, a step in forming high-density MIMCAPs is shown. The exposed region of the inter-layer dielectric 102 is damaged by a plasma process. In particular, the damage may be caused by a plasma operation that removes the carbon from the SiCOH inter-layer dielectric 102. The plasma may include an oxygen plasma, an ammonia plasma, nitrogen or hydrogen plasma. The plasma process is continued until a thickness 302 of the inter-layer dielectric 102 extending substantially below the conductors 104 is damaged.

Figure 4:
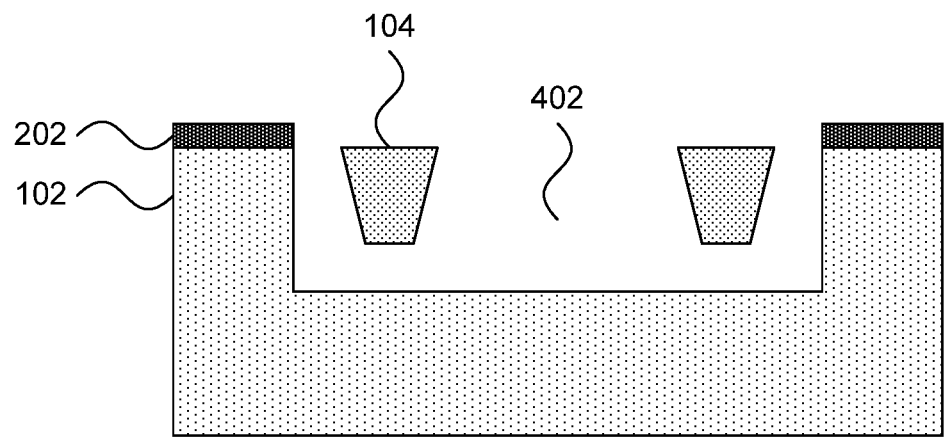
FIG. 4 is a cross-sectional diagram of a step in the formation of a metal-insulator-metal capacitor having increased capacitance density in accordance with the present principles.

Referring now to FIG. 4, a step in forming high-density MIMCAPs is shown. The damaged region 302 is removed to expose the conductors 104. The damaged portion 302 of the inter-layer dielectric 102 can be removed by an etch process that is selective to the portion of the inter-layer dielectric 102 that has not been damaged. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In some embodiments, the damaged portion 302 of the inter-layer dielectric 102 may be removed using a wet or dry etch process. In one embodiment, the damaged portion 302 of the inter-layer dielectric 102 is removed by a dilute hydrofluoric acid wash.

As shown in FIG. 4, the conductors 104 are suspended in an airgap 402. These conductors 104 are three dimensional structures that extend into and out of the page and are in contact with sidewalls of the airgap 402.

Figure 5:
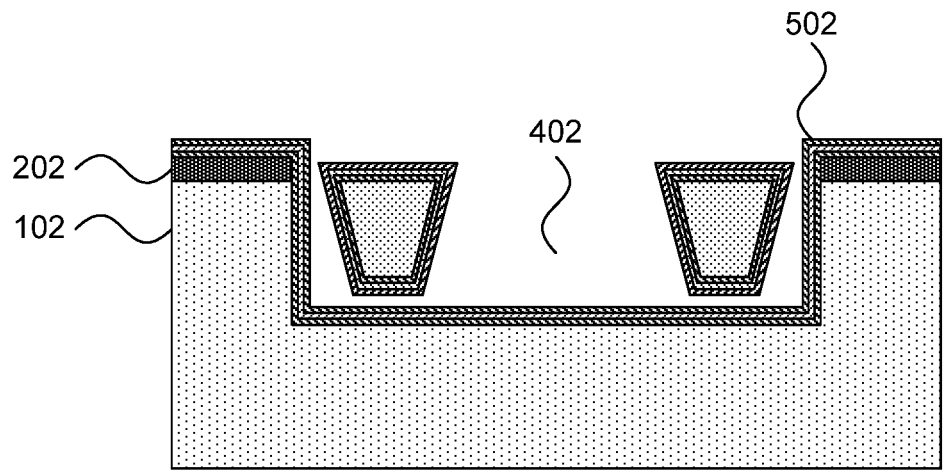
FIG. 5 is a cross-sectional diagram of a step in the formation of a metal-insulator-metal capacitor having increased capacitance density in accordance with the present principles.

Referring now to FIG. 5, a step in forming high-density MIMCAPs is shown. A MIMCAP stack 502 is formed over the interior surfaces of the airgap 402 and over the exterior surfaces of the conductors 104. The MIMCAP stack 502 will be shown in greater detail below and is formed from an insulator layer sandwiched between two metallic layers. By extending the MIMCAP stack 502 over the conductors 104, the surface area of the MIMCAP stack 502 is significantly increased.

Figure 6:
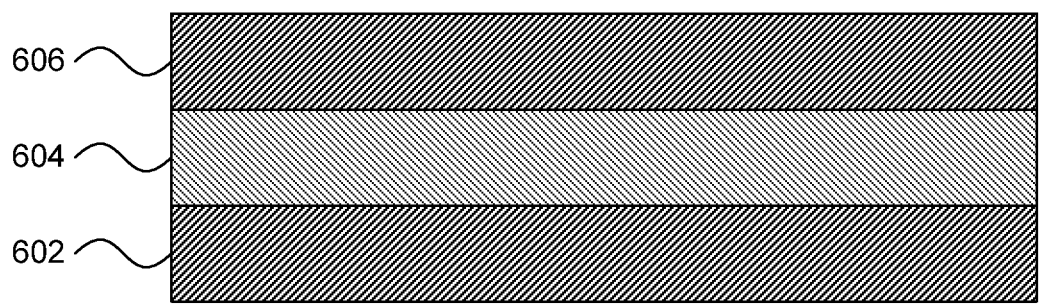
FIG. 6 is a detailed cross-sectional diagram of a metal-insulator-metal capacitor layer in accordance with the present principles.

Referring now to FIG. 6, greater detail on the MIMCAP stack 502 is shown. A first metallic layer 602 is formed on a surface, followed by an insulator layer 604, followed by a second metallic layer 606. The layers form what is in essence a parallel plate capacitor, with the capacitance being based on the surface area of the layers and on the relative permittivity, or dielectric constant, of the insulator layer 604.

It is specifically contemplated that the first metallic layer 602 and the second metallic layer 606 may be formed from titanium nitride and that the insulator layer 604 may be formed from a hafnium oxide. Alternative embodiments may employ any appropriate conductive material for the first and second metallic layers, and indeed these layers need not even include a metal if they are sufficiently conductive (e.g., in the case of metallic carbon nanotubes). Alternative embodiments may also employ alternative insulating materials, though it is contemplated that a high-k dielectric is used to maximize capacitance. Exemplary alternative dielectric materials include zirconium oxides, aluminum oxides, titanium oxides, lanthanum oxides, strontium-titanium oxides, lanthanum-aluminum oxides, yttrium oxides, hafnium silicates, hafnium-silicon oxynitride, or combinations thereof.

In one embodiment, the first and second metallic layers 602 and 606 are about 5 nm thick and the insulator layer 604 is about 4 nm thick. It is specifically contemplated that the respective MIMCAP layers may be deposited using consecutive ALD processes, although CVD, PVD, and GCIB deposition may be used instead.

Figure 7:
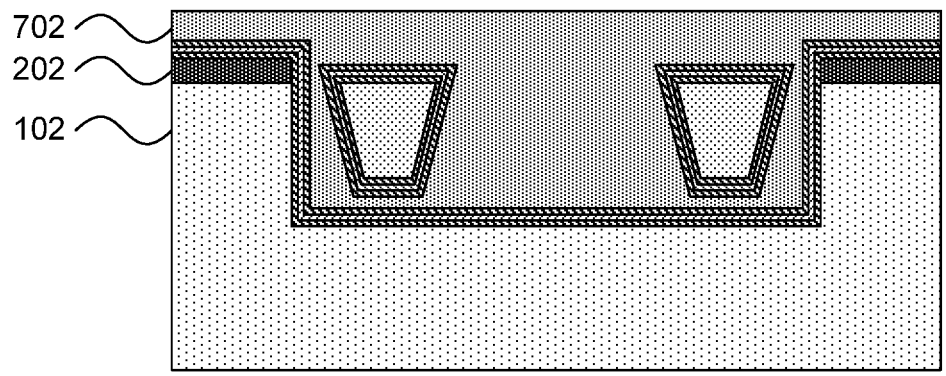
FIG. 7 is a cross-sectional diagram of a step in the formation of a metal-insulator-metal capacitor having increased capacitance density in accordance with the present principles.

Referring now to FIG. 7, a step in forming high-density MIMCAPs is shown. The airgap 402 is filled with a passivating dielectric material 702. It is specifically contemplated that silicon dioxide may be used as the passivating dielectric material 702, but any appropriate dielectric material may be used instead. The passivating dielectric material 702 may be deposited by some flowable process or by a spin-on process. Alternatively, the passivating dielectric material 702 may be deposited using any appropriate deposition process, such as CVD.

Figure 8:
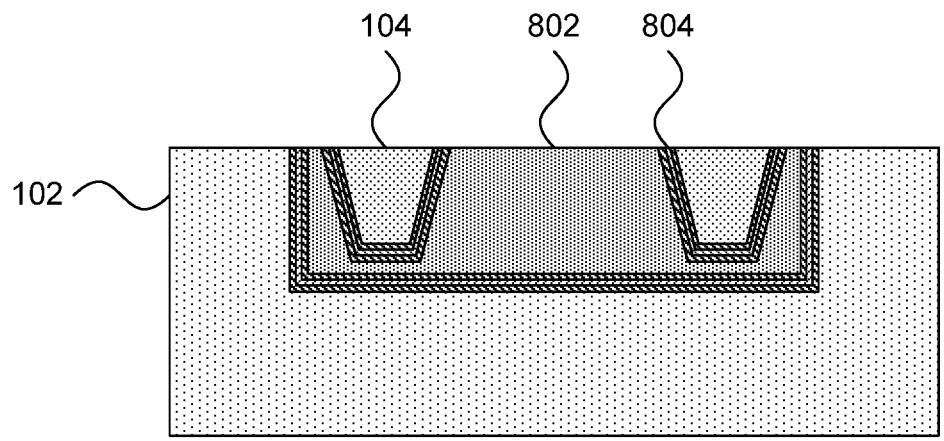
FIG. 8 is a cross-sectional diagram of a step in the formation of a metal-insulator-metal capacitor having increased capacitance density in accordance with the present principles.

Referring now to FIG. 8, a step in forming high-density MIMCAPs is shown. The passivating dielectric material 702 is polished down, along with any remaining hardmask material 202 and any portion of the MIMCAP stack 502 above the conductors 104. The resulting structure has top surfaces of the conductors 104 exposed.

The polishing process may be performed using chemical-mechanical planarization (CMP). CMP is performed using, e.g., a chemical or granular slurry and mechanical force to gradually remove upper layers of the device. The slurry may be formulated to be unable to dissolve, for example, the conductor material, resulting in the CMP process's inability to proceed any farther than that layer.

Figure 9:
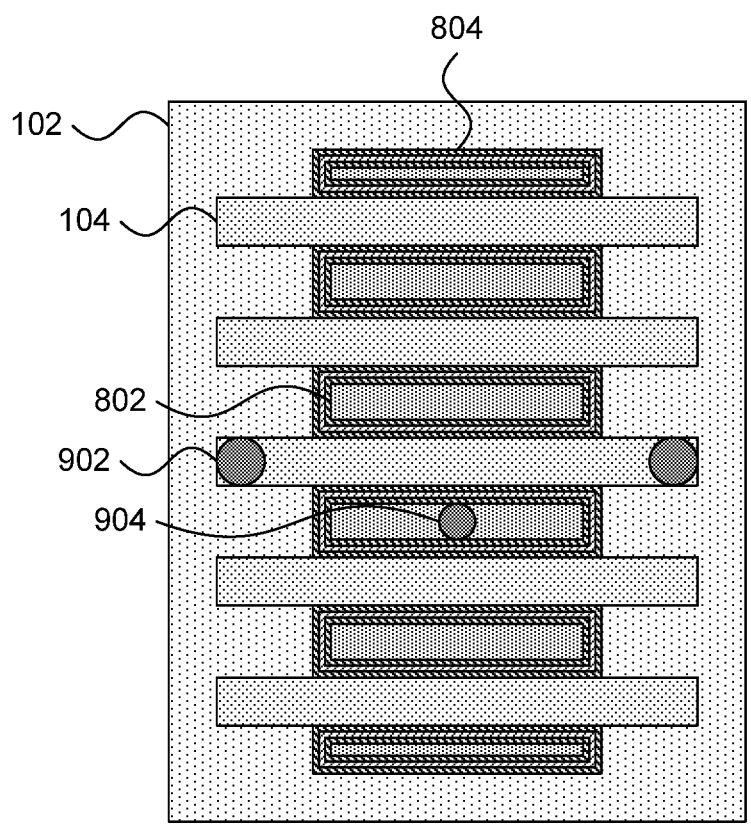
FIG. 9 is a top-down diagram of a step in the formation of a metal-insulator-metal capacitor having increased capacitance density in accordance with the present principles.

Referring now to FIG. 9, a top-down view of a step in forming high-density MIMCAPs is shown. This view shows five conductors 104 instead of the two conductors 104 shown in the above embodiments. The polished passivating dielectric 802 is visible between conductors 104 and the polished MIMCAP stack 804 contacts all vertical surfaces. In particular, it should be recognized that the first metallic layer 602 of the polished MIMCAP stack 804 is in contact with the conductors 104 and forms an electrical connection between them. The conductors 104 themselves extend into the inter-layer dielectric 102, which supports them and provides area for electrical contacts 902.

In addition, an electrical contact 904 is formed in the passivating dielectric 802 that penetrates through to the MIMCAP stack 804 beneath the passivating dielectric 802. This second electrical contact 904 connects to the second metallic layer 606 of the MIMCAP stack 804. Thus, contacts 902 and 904 provide electrical access to both terminals of the capacitor. In alternative embodiments, additional contacts can be placed, for example at and between each conductor 104.

It should be noted that the length of the conductors 104 is limited by the physical properties of the conductor material, as capillary forces and other effects may cause the conductors to deform and come into contact with one another or with the bottom of the gap if they are too long. It is specifically contemplated that copper conductors may have a total length of about 800 nm to about 1 µm, but other materials and geometries of conductor may provide additional length. In addition, certain fabrication processes, for example when removing the damaged dielectric material, may decrease the likelihood of flopover.

The present embodiments provide a significantly higher capacitance density than conventional devices. In one exemplary embodiment, a capacitance density of about 64.8 fF/µm$^2$. In this embodiment, the capacitor region is about 1 µm by about 0.680 µm, with a depth of about 90 nm, and with 10 conductors being arranged therein. The size of the MIMCAP can be made as large as is needed, using long rows of conductors 104 to achieve any desired capacitance, limited only by the area available for the capacitor and any wiring needed. A small number of conductors 104 can be connected by a single contact, but a large number of conductors 104 may benefit from additional contacts 902 and 904.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 10:
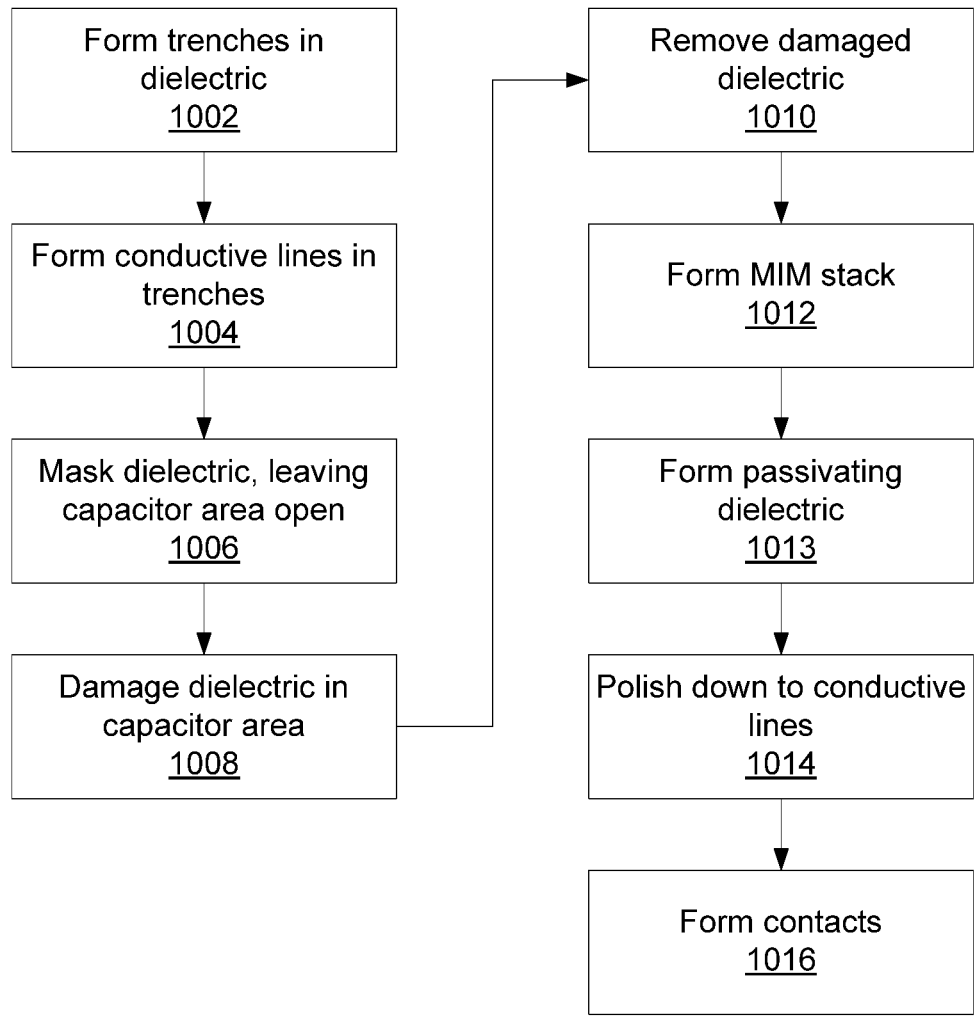
FIG. 10 is a block/flow diagram of a method of fabricating a metal-insulator-metal capacitor having increased capacitance density in accordance with the present principles.

Referring now to FIG. 10, a method of forming MIMCAPs is shown. Block 1002 forms trenches in an inter-layer dielectric 102. As noted above, the trenches may be formed using a timed, anisotropic etch such as RIE, and the trenches may have an exemplary length of about 800 nm to about 1 µm. Block 1004 then deposits conductive material, such as copper, in the trenches to form conductors 104.

Block 1006 forms a mask on the inter-layer dielectric 102 that leaves open a capacitor region. Block 1008 then damages the exposed inter-layer dielectric material using, for example, a plasma process. In the case of using SiCOH as the inter-layer dielectric, this damaging process removes the carbon from the material. Block 1010 then etches away the damaged material, for example using a wet etch that includes dilute hydrofluoric acid to selectively remove the damaged material, leaving the conductors 104 suspended over air gap 402.

Block 1012 forms the metal-insulator-metal stack 502 conformally over all surfaces, including the surfaces of the conductors 104. Block 1013 then deposits a passivating dielectric material 702 in the air gap 402, filling to the height of the air gap and above. Block 1014 polishes the top layers of the passivating dielectric 702 and the MIM stack 502 to expose the top surface of the conductors 104. Block 1016 then forms contacts to the MIMCAP, with one set of contacts being formed to electrically contact the conductors 104, and another set of contacts being formed in contact with the MIM stack 502.

Having described preferred embodiments of high-density MIM capacitors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a capacitor, comprising:
   forming a gap in a dielectric layer underneath one or more conducting lines, such that the one or more conducting lines are suspended over the gap; and
   forming a capacitor stack directly on sidewalls of the gap and on the conducting lines.

2. The method of claim 1, wherein forming the gap comprises:
   masking the dielectric layer, with a capacitor region left unmasked;
   damaging the dielectric layer in the capacitor region; and
   removing the damaged dielectric material.

3. The method of claim 1, wherein forming the capacitor stack comprises forming a first metallic layer, an insulator layer, and a second metallic layer.

4. The method of claim 1, further comprising depositing a passivating dielectric material in the gap after forming the capacitor stack.

5. The method of claim 1, further comprising polishing away portions of the capacitor stack on horizontal surfaces above the one or more conducting lines.

6. The method of claim 2, wherein damaging the dielectric layer comprises applying a plasma process.

7. The method of claim 3, wherein the first metallic layer is in direct contact with all of the one or more conducting lines.

8. The method of claim 3, wherein the first and second metallic layers are titanium nitride and wherein the insulator layer is a hafnium oxide.

9. The method of claim 3, wherein the insulator layer is disposed between the first and second metallic layers.

10. The method of claim 4, further comprising forming a contact on the capacitor stack by forming a hole that penetrates the passivating dielectric material and depositing a contact material in the hole.

11. The method of claim 6, wherein removing the damaged dielectric material comprises applying dilute hydrofluoric acid.

12. A method for forming a capacitor, comprising:
    forming a gap in a dielectric layer underneath one or more conducting lines, such that the one or more conducting lines are suspended over the gap, comprising:
        damaging material in the dielectric layer in a capacitor region; and
        removing the damaged material;
    forming a stack directly on sidewalls of the gap and on the conducting lines that comprises a first metallic layer in direct contact with all of the one or more conducting lines, an insulator layer, and a second metallic layer; and
    forming a passivating dielectric material in the gap after forming the stack.

13. The method of claim 12, wherein removing the damaged dielectric material comprises applying dilute hydrofluoric acid.

14. The method of claim 12, wherein the first and second metallic layers are titanium nitride and wherein the insulator layer is a hafnium oxide.

15. The method of claim 12, further comprising polishing away portions of the stack on horizontal surfaces above the one or more conducting lines.

16. A capacitor, comprising:
    one or more conducting lines formed over a gap in a dielectric layer; and
    a capacitor stack formed on directly on sidewalls of the gap and on surfaces of the one or more conducting lines, wherein the stack on the surfaces of the gap is continuous with the stack formed on surfaces of the one or more conducting lines.

17. The capacitor of claim 16, wherein the capacitor stack comprises a first metallic layer, an insulator layer, and a second metallic layer, the insulator layer being disposed between the first metallic layer and the second metallic layer.

18. The capacitor of claim 16, further comprising a passivating layer that fills the gap.

19. The capacitor of claim 17, wherein the first metallic layer is in direct contact with all of the one or more conducting lines.

20. The capacitor of claim 17, further comprising a first electrical contact to the one or more conducting lines and a second electrical contact to the second metallic layer.

* * * * *